United States Patent
Okabe

(10) Patent No.: US 11,133,208 B2
(45) Date of Patent: Sep. 28, 2021

(54) EFEM AND METHOD OF INTRODUCING DRY AIR THEREINTO

(71) Applicant: TDK CORPORATION, Tokyo (JP)

(72) Inventor: Tsutomu Okabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 185 days.

(21) Appl. No.: 15/991,345

(22) Filed: May 29, 2018

(65) Prior Publication Data

US 2019/0013227 A1 Jan. 10, 2019

(30) Foreign Application Priority Data

May 31, 2017 (JP) .............................. JP2017-108658
May 2, 2018 (JP) .............................. JP2018-088728

(51) Int. Cl.
*H01L 21/673* (2006.01)
*H01L 21/677* (2006.01)
*H01L 21/67* (2006.01)

(52) U.S. Cl.
CPC .. *H01L 21/67389* (2013.01); *H01L 21/67017* (2013.01); *H01L 21/6773* (2013.01); *H01L 21/67742* (2013.01); *H01L 21/67763* (2013.01)

(58) Field of Classification Search
CPC ......... H01L 21/67763; H01L 21/67389; H01L 21/6773; F24F 3/161
See application file for complete search history.

(56) References Cited

U.S. PATENT DOCUMENTS

| | | | |
|---|---|---|---|
| 6,356,338 B2 * | 3/2002 | Arakawa | G03B 27/52 118/719 |
| 2004/0168742 A1 | 9/2004 | Kim et al. | |
| 2007/0169628 A1 * | 7/2007 | Tetsuya | B01D 53/06 96/143 |
| 2015/0024671 A1 | 1/2015 | Taniyama et al. | |
| 2015/0045961 A1 * | 2/2015 | Koshti | H01L 21/67207 700/276 |
| 2015/0170945 A1 | 6/2015 | Segawa et al. | |
| 2018/0040493 A1 * | 2/2018 | Kawai | C12M 37/00 |

(Continued)

FOREIGN PATENT DOCUMENTS

| | | |
|---|---|---|
| JP | H10-340874 A | 12/1998 |
| JP | 2014-038888 A | 2/2014 |
| JP | 2014-116441 A | 6/2014 |

(Continued)

*Primary Examiner* — Steven S Anderson, II
(74) *Attorney, Agent, or Firm* — Oliff PLC

(57) ABSTRACT

An EFEM includes first and second chambers, an airflow formation unit, and a gas discharge port. The first chamber includes a dry air introduction port. The second chamber is connected with a lower part of the first chamber and includes an openable door. The airflow formation unit produces a circulating airflow between the first and second chambers. The gas discharge port discharges a gas of the second chamber therefrom. The first and second chambers are connected via first and second communication sections. In the first communication section, a filter is disposed, and an airflow from the first chamber to the second chamber is generated. In the second communication section, a ventilation state is changed by a ventilation state switchable unit, and an airflow from the second chamber to the first chamber is generated.

18 Claims, 7 Drawing Sheets

(56) References Cited

U.S. PATENT DOCUMENTS

2018/0211850 A1   7/2018  Kondoh
2019/0145641 A1   5/2019  Taniyama et al.

FOREIGN PATENT DOCUMENTS

| JP | 2015-023037 A | | 2/2015 | |
|----|---------------|---|--------|---|
| JP | 2016-162818 A | | 9/2016 | |
| JP | 2016162818 A | * | 9/2016 | ............ B01D 53/04 |
| JP | 2017-028110 A | | 2/2017 | |
| KR | 10-2015-0069526 A | | 6/2015 | |
| TW | 201530680 A | | 8/2015 | |

* cited by examiner ated airflow between the first chamber and the second chamber; and

EFEM AND METHOD OF INTRODUCING DRY AIR THERETO

BACKGROUND OF THE INVENTION

1. Field of the Invention

The present invention relates to an EFEM configured to transport wafers from a transportation container to a processing chamber in a semiconductor factory, and to a method of introducing a dry air into the EFEM.

2. Description of the Related Art

In a step of manufacturing semiconductors, wafers are transported among processing apparatuses using a wafer transportation container referred to as a FOUP, a FOSB, etc. When the wafers are transported from the wafer transportation container to the processing chamber, an Equipment Front End Module (EFEM) is used. The EFEM produces a clean space, which is called a minienvironment or so, that is cleaner than the space in a factory and transports the wafers between the wafer transportation container and the processing chamber via the clean space. Thus, an environment where the wafers are exposed is kept clean even when the wafers are being transported from the wafer transportation container to the processing chamber, and the wafers can be protected from oxidation or so (see Patent Document 1 etc.).

Proposed nowadays is a circulation-type EFEM where gas can circulate therein. In such a circulation-type EFEM, the consumption of gas can be reduced by circulating a replacement gas, such as nitrogen, in the circulation-type EFEM.

SUMMARY OF THE INVENTION

In a conventional EFEM, however, a humidity in the EFEM cannot quickly decrease in returning to a normal operation once again if gas in the factory flows into the EFEM by opening a door of the EFEM for maintenance, and an operation stop time of the EFEM by maintenance or so is long.

The present invention has been achieved under such circumstances. It is an object of the invention to provide an EFEM capable of quickly decrease a humidity in the EFEM even if the humidity temporarily increases by inflow of gas in a factory into the EFEM, and provide a method of introducing a dry air into the EFEM.

An EFEM according to a first aspect of the present invention comprises:
  a first chamber including a dry air introduction port configured to introduce a dry air;
  a second chamber connected with a lower part of the first chamber and including an openable door allowing a person to go in and out;
  an airflow formation unit configured to produce a circulating airflow between the first chamber and the second chamber; and
  a gas discharge port configured to discharge a gas of the second chamber therefrom,
  wherein the first chamber and the second chamber are connected via:
    a first communication section where a filter is disposed, and an airflow from the first chamber to the second chamber is generated at the time of formation of the circulating airflow; and
    a second communication section where a ventilation state is changed by a ventilation state switchable unit, and an airflow from the second chamber to the first chamber is generated at the time of formation of the circulating airflow.

In the EFEM according to the first aspect of the present invention, the ventilation state switchable unit switches a ventilation state of the second communication section and limits a movement of gas via the second communication section, and a dry air introduced into the first chamber can thereby effectively be introduced into the filter disposed in the first communication section. Even if a non-dry air flows into the second chamber, the EFEM can prevent this non-dry air from circulating in the first and second chambers of the EFEM and flowing into the filter. Thus, even if a non-dry air in a factory flows into the second chamber, the EFEM can prevent this non-dry air from going toward the filter and prevent water from attaching to the filter. Thus, the EFEM can quickly decrease a humidity of the second chamber of the EFEM after blocking the inflow of the wet air even if the humidity increases temporarily, and the EFEM can reduce an operation stop time from maintenance or so to the return of the normal operation.

For example, the gas discharge port may be connected with the second chamber at a position that is closer to the second communication section than the first communication section, and the ventilation state switchable unit may be disposed in the second communication section positioned below the dry air introduction port and above the gas discharge port.

In the EFEM according to the first aspect of the present invention, since the gas discharge port is disposed away from the first communication section with the filter, even if a non-dry air flows into the second chamber, this non-dry air can effectively be introduced into the gas discharge port and can be prevented from flowing into the first communication section with the filter.

For example, the ventilation state switchable unit may comprise a valve configured to switch a ventilation state of the second communication section between:
  a state where the gas is movable from the second chamber to the first chamber via the second communication section; and
  a state where the gas is unmovable from the second chamber to the first chamber via the second communication section.

Since the ventilation state switchable unit has the valve, even if a non-dry air flows into the second chamber, the EFEM according to the first aspect of the present invention can prevent the circulation of this non-dry air in the first chamber and the second chamber and the inflow of this non-dry air from the first chamber into the filter.

An EFEM according to a second aspect of the present invention comprises:
  a first chamber including a dry air introduction port configured to introduce a dry air;
  a second chamber connected with a lower part of the first chamber and including an openable door to the outside;
  an airflow formation unit configured to produce a circulating airflow between the first chamber and the second chamber; and
  a gas discharge port configured to discharge a gas of the second chamber therefrom,
  wherein the first chamber and the second chamber comprise:
    a downward airflow section where a downward airflow is generated at the time of formation of the circulating airflow; and an upward airflow section where an upward airflow is generated at the time of formation of the circulating airflow, wherein a filter is disposed in the downward airflow section, wherein the gas discharge port is disposed in the upward airflow section, and wherein a ventilation resistance portion whose ventilation resistance is higher than that of the filter is disposed above the gas discharge port in the upward airflow section.

In the EFEM according to the second aspect of the present invention, the ventilation resistance portion is disposed above the gas discharge port in the upward airflow section and limits a movement of gas, and the dry air introduced into the first chamber can effectively be introduced into the filter disposed in the downward airflow section. Even if a non-dry air flows into the second chamber, the EFEM can prevent this non-dry air from circulating in the first and second chambers of the EFEM and flowing into the filter. Thus, even if a non-dry air in a factory flows into the second chamber, the EFEM can prevent this non-dry air from going toward the filter and prevent water from attaching to the filter. Thus, the EFEM can quickly decrease a humidity of the second chamber of the EFEM after blocking the inflow of the wet air even if the humidity increases temporarily, and the EFEM can reduce an operation stop time from maintenance or so to the return of the normal operation.

For example, the ventilation resistance portion may comprise a second filter whose ventilation resistance is higher than that of the filter.

In the EFEM according to the second aspect of the present invention, the second filter is used as the ventilation resistance portion, and the second filter can thereby properly limit the formation of the circulating airflow.

For example, the EFEM according to the second aspect of the present invention may further comprise a second airflow formation unit disposed in the upward airflow section and configured to switch a ventilation state of the ventilation resistance portion by changing a strength of the upward airflow in the upward airflow section.

In the EFEM according to the second aspect of the present invention including the second airflow formation unit, a ventilation amount of the second filter can be changed by changing the strength of the upward airflow in the upward airflow section even if the second filter, which is the ventilation resistance portion, is being fixed. The second airflow formation unit can increase a ventilation amount of the second filter and help the airflow formation unit produce the circulating airflow by increasing the strength of the upward airflow in the upward airflow section.

For example, the ventilation resistance portion may comprise a valve configured to switch a ventilation state of the ventilation resistance portion between:

a state where the gas is movable from the second chamber to the first chamber via the ventilation resistance portion; and a state where the gas is unmovable from the second chamber to the first chamber via the ventilation resistance portion.

The ventilation resistance portion may not be the second filter, but may be a valve that does not pass the airflow when the ventilation resistance portion is closed.

A method of introducing a dry air into the EFEM according to first aspect of the present invention comprises:

an introduction step of introducing the dry air into a first chamber via a dry air introduction port;

a switch step of switching a ventilation state of a second communication section among first and second communication sections connecting the first chamber and a second chamber connected with a lower part of the first chamber so that the ventilation state becomes a non-circulating state where a ventilation amount of the dry air in the first communication section with a filter is larger than a ventilation amount of the dry air in the second communication section; and a discharge step of discharging a gas of the second chamber.

In the method according to the first aspect of the present invention, the non-circulating state can limit a ventilation amount of the second communication section and effectively introduce the dry air introduced in the first chamber into the filter disposed in the first communication section. In this method, even if a non-dry air flows into the second chamber, this non-dry air can be prevented from circulating in the first chamber and the second chamber and flowing into the filter. In this method, even if a non-dry air in a factory flows into the second chamber of the EFEM according to first aspect of the present invention, it is thereby possible to prevent this non-dry air from going toward the filter and attaching water to the filter.

For example, the gas of the second chamber may be discharged in the discharge step from a gas discharge port connected with the second chamber at a position that is closer to the second communication section than the first communication section.

In the method according to the first aspect of the present invention, since the gas discharge port is disposed away from the first communication section with the filter, even if a non-dry air flows into the second chamber, this non-dry air can effectively be introduced into the gas discharge port and can be prevented from flowing into the first communication section with the filter.

For example, the method according to the first aspect of the present invention may further comprise an unlock step of unlocking an openable door disposed in the second chamber and allowing a person to go in and out in the non-circulating state during the introduction step.

In the method according to the first aspect of the present invention, since the unlock of the openable door is controlled, it is possible to limit the timing for opening the openable door, where a non-dry air in a factory may flow into the second chamber, and securely prevent this wet air from flowing into the first communication section with the filter.

A method of introducing a dry air into the EFEM according to the second aspect of the present invention comprises:

an introduction step of introducing the dry air into a first chamber via a dry air introduction port; and a discharge step of discharging a gas of a second chamber connected with a lower part of the first chamber via a gas discharge port connected with the second chamber below a ventilation resistance portion in an upward airflow section where an upward airflow is generated in a non-circulating state where a ventilation amount of the dry air of a filter disposed in a downward airflow section where a downward airflow is generated is larger than a ventilation amount of the dry air of the ventilation resistance portion in the upward airflow section.

In the method according to the second aspect of the present invention, the dry air is introduced in the non-circulating state and can thereby effectively be introduced into the filter disposed in the downward airflow section. In this method, since the gas discharge port is disposed below the ventilation resistance portion in the upward airflow section, even if a non-dry air flows into the second chamber, this wet air is prevented from passing the ventilation resistance portion and is smoothly discharged from the gas discharge port. In this method, even if a non-dry air in a factory flows into the second chamber of the EFEM according to second aspect of the present invention, it is thereby possible to prevent this non-dry air from going toward the filter and attaching water to the filter.

For example, a second airflow formation unit disposed in the upward airflow section and configured to change a strength of the upward airflow may be stopped from being driven in the discharge step by reducing a ventilation amount of the ventilation resistance portion and producing the non-circulating state.

In the method according to the second aspect of the present invention, even if the ventilation resistance portion is a second filter etc. that cannot switch the ventilation state by itself, stopping the driving of the second airflow formation unit can reduce a ventilation amount of the ventilation resistance portion and can properly achieve the non-circulating state in the EFEM.

For example, the method according to the second aspect of the present invention may further comprise a stop step of stopping a driving of an airflow formation unit configured to produce a circulating airflow between the first chamber and the second chamber.

In this method, since the dry air is introduced after stopping the driving of the airflow formation unit, even if a non-dry air is introduced into the second chamber, this non-dry air can effectively be introduced into the gas discharge port and can be prevented from flowing into the filter.

DETAILED DESCRIPTION OF THE PREFERRED EMBODIMENT

Hereinafter, the present invention is described based on embodiments shown in the figures.

Figure 1:
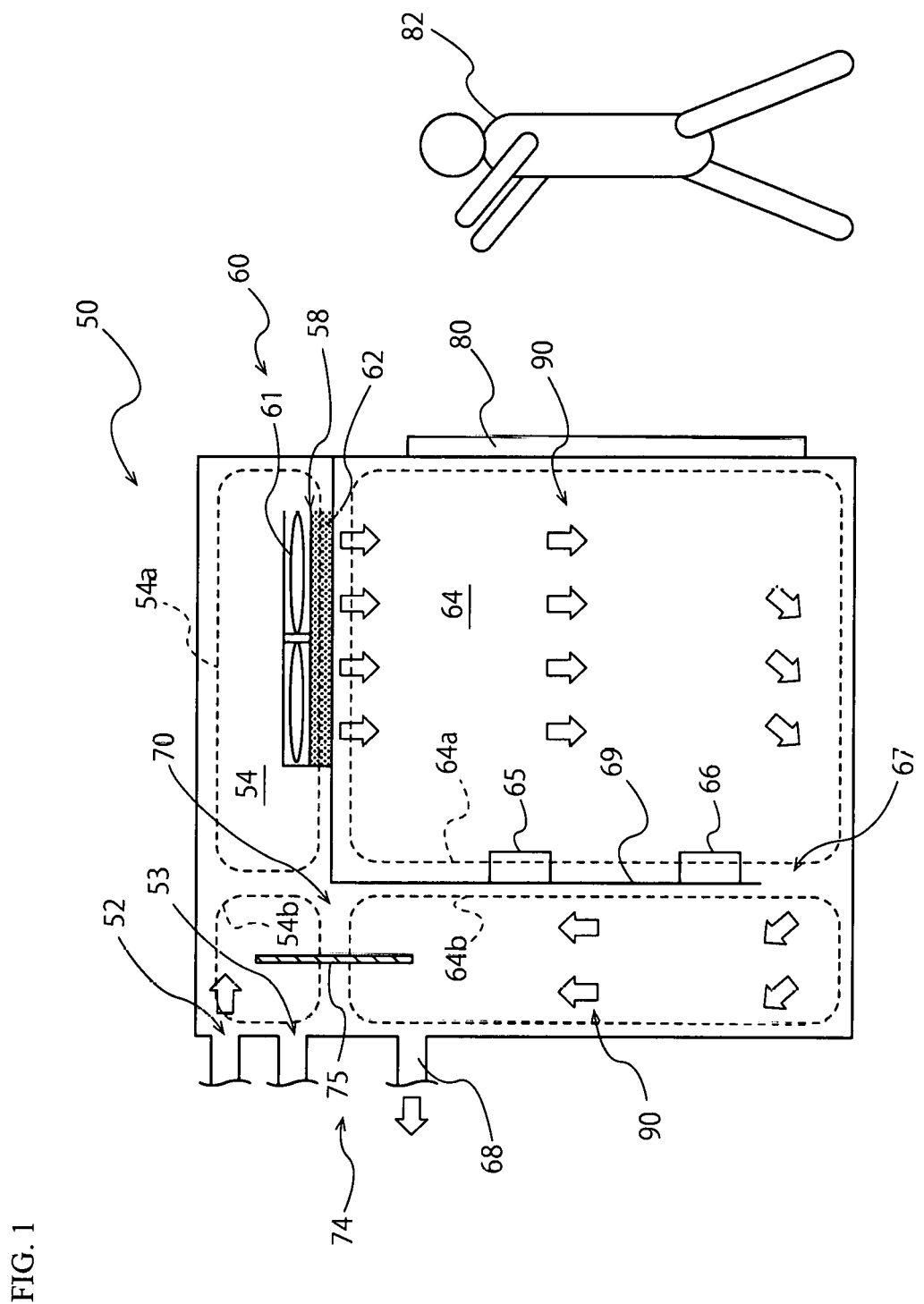
FIG. 1 a schematic view showing a formation state of a circulating airflow in an EFEM according to an embodiment of the present invention.

FIG. 1 is a schematic view of an equipment front end module (EFEM) 50 according to an embodiment of the present invention. The EFEM 50 is an apparatus used for delivering wafers between a FOUP (not shown), which is a wafer transportation container for transporting wafers, and a processing chamber (not shown), where the wafers are processed, in a semiconductor factory.

The EFEM 50 includes a second chamber 64 configured to produce a clean space called a minienvironment in the second chamber 64, and wafers housed in the FOUP are transported into the processing chamber via the second chamber 64. Although not shown in FIG. 1, the EFEM 50 includes a load port apparatus having an installation stand where the FOUP is installed, a door for airtightly connecting the FOUP and the second chamber 64, and the like.

The arrows 90 shown in FIG. 1 represent how a circulating airflow is formed in the EFEM 50 during the normal operation, where the wafers are being transported in the second chamber 64 of the EFEM 50. In the EFEM 50 according to the present embodiment, a nitrogen gas as a replacement gas is introduced into the second chamber 64 connected with a lower part of a first chamber 54 disposed above the second chamber 64 (a second-story part if the second chamber 64 is considered to be a first-story part) via the first chamber 54.

As shown in FIG. 1, two communication sections (first communication section 58 and second communication section 70) are arranged between the first chamber 54 and the second chamber 64 and connect the first chamber 54 and the second chamber 64.

In the normal operation state, the nitrogen gas introduced in the first chamber 54 and the second chamber 64 moves via the first communication section 58 and the second communication section 70 and produces a circulating airflow circulating between the first chamber 54 and the second chamber 64 as shown by the arrows 90 in FIG. 1. The wafers are transported between the FOUP and the processing chamber while the circulating airflow of the nitrogen gas is circulating in the first chamber 54 and the second chamber 64 as shown in FIG. 1.

In addition to the first chamber 54 and the second chamber 64, the EFEM 50 includes a gas introduction port 52, a dry air introduction port 53, an airflow formation unit 60, a filter 62, a ventilation state switchable unit 74, a gas discharge port 68, an openable door 80, and the like. Although not shown in FIG. 1, the EFEM 50 includes a transportation robot disposed in the second chamber 64 and configured to transport the wafers, a load port apparatus for connecting the FOUP and the second chamber 64, and the like.

As shown in FIG. 1, the first chamber 54 includes the gas introduction port 52 configured to introduce the nitrogen gas and the dry air introduction port 53 configured to introduce the dry air. The gas introduction port 52 is disposed on a sidewall or a ceiling of the first chamber 54, and the nitrogen gas as a replacement gas is introduced into the first chamber 54 via the gas introduction port 52. The nitrogen gas is supplied from a nitrogen gas tank or so (not shown) via an introduction channel. The replacement gas may be another inert gas other than nitrogen gas. The dry air introduction port 53 is described below using FIG. 2.

As shown in FIG. 1, the first chamber 54 is connected with the upper part of the second chamber 64 and disposed right above the second chamber 64. The first chamber 54 has any size. In an example of FIG. 2, the height of the first chamber 54 is smaller than that of the second chamber 64 disposed below the first chamber 54, and the projection area of the first chamber 54 from above is the same as that of the second chamber 64 disposed below the first chamber 54. When the first chamber 54 has a space that is smaller than a space of the second chamber 64, the replacement gas and the dry air can efficiently be supplied to the filter 62, and the EFEM 50 can be prevented from being larger.

As shown in FIG. 1, the second chamber 64 is connected with the lower part of the first chamber 54 and includes the openable door 80 allowing a person to go in and out. The openable door 80 includes a lock mechanism. When the lock mechanism unlocks the openable door 80, a person 82 for maintenance or so can open the openable door 80 and enter the second chamber 64 (see FIG. 2). The lock mechanism of the openable door 80 is controlled by a controller (not shown). For example, the controller unlocks the openable door 80 if an oxygen concentration of the second chamber 64 is a predetermined value or more.

The second chamber 64 includes a hygrometer 65 configured to measure a humidity of the second chamber 64 and an oxygen densitometer 66 configured to measure an oxygen concentration of the second chamber 64. Moreover, the second chamber 64 may include other measuring instruments such as a pressure indicator.

As shown in FIG. 1, the second chamber 64 includes a second progress section 64a and a second regress section 64b. The second progress section 64a is a region where the wafers or so are transported. The second regress section 64b is formed by a return duct. The second progress section 64a and the second regress section 64b are horizontally arranged next to each other, and both of the second progress section 64a and the second regress section 64b are connected with the lower part of the first chamber 54. The second progress section 64a and the second regress section 64b are divided by an intermediate wall 69 extending downward from the ceiling of the second chamber 64. A lower communication section 67 connecting lower parts of the second progress section 64a and the second regress section 64b is formed below the intermediate wall 69. The second regress section 64b is communicated with the second progress section 64a via the lower communication section 67.

During formation of the circulating airflow as shown in FIG. 1, a downward airflow is generated in the second progress section 64a of the second chamber 64, and an upward airflow is generated in the second regress section 64b of the second chamber 64. The first chamber 54 includes a first progress section 54a connected with the upper part of the second progress section 64a and a first regress section 54b connected with the upper part of the second regress section 64b. As shown by the arrows 90 of FIG. 1, the circulating airflow circulates in the first chamber 54 and the second chamber 64 in the order of the first progress section 54a, the second progress section 64a, the second regress section 64b, the first regress section 54b, the first progress section 54a, . . . .

As shown in FIG. 1, the first chamber 54 and the second chamber 64 are connected via the first communication section 58 and the second communication section 70. In the first communication section 58, an airflow (downward airflow) going from the first chamber 54 to the second chamber 64 is generated during formation of the circulating airflow. The first communication section 58 includes the filter 62 and the airflow formation unit 60 configured to produce the circulating airflow between the first chamber 54 and the second chamber 64.

The airflow formation unit 60 includes a ventilation fan 61 and a drive unit configured to drive the ventilation fan 61. The ventilation fan 61 rotates by receiving controls from a controller (not shown), and the circulating airflow shown in FIG. 1 is produced in the EFEM 50. The airflow formation unit 60 reduces particles floating in the second chamber 64 by generating a downward airflow in the second progress section 64a of the second chamber 64, and it is thereby possible to increase cleanliness of the second progress section 64a of the second chamber 64. Moreover, the airflow formation unit 60 can reduce the consumption of nitrogen gas filled in the EFEM 50 via the gas introduction port 52 by forming a circulating gas going up in the second regress section 64b of the second chamber 64, returning to the first chamber 54 via the second communication section 70, and returning to the first communication section 58 via the first regress section 54b and the first progress section 54a of the first chamber 54.

The filter 62 increases cleanliness of the EFEM 50 by removing particles and a predetermined component contained in the gas of the first chamber 54 and the second chamber 64. The filter 62 may be any filter, such as a combination of a particle removal filter and a chemical filter. The airflow formation unit 60 and the filter 62 arranged in the first communication section 58 may be a fan filter unit (FFU) formed by integrating the ventilation fan 61 and the filter 62 of the airflow formation unit 60, or the airflow formation unit 60 and the filter 62 may be separate from each other. When the airflow formation unit 60 and the filter 62 are separate from each other, for example, the ventilation fan 61 of the airflow formation unit 60 can be disposed on the ceiling or so of the first chamber 54.

As shown in FIG. 1, an airflow (upward airflow) going from the second chamber 64 to the first chamber 54 is generated in the second communication section 70 during formation of the circulating airflow. The second communication section 70 includes the ventilation state switchable unit 74 configured to switch a ventilation state of the second communication section 70. The ventilation state switchable unit 74 includes a valve 75 configured to switch a ventilation state of the second communication section 70 between a state where gas is movable from the second chamber 64 to the first chamber 54 via the second communication section 70 (see FIG. 1) and a state where gas is unmovable from the second chamber 64 to the first chamber 54 via the second communication section 70 (see FIG. 2). Examples of the valve 75 include a butterfly valve or gate valve that blocks and opens the second communication section 70 and can adjust a ventilation amount of the second communication section 70, but the valve 75 may be another valve, a shutter, or the like.

Figure 2:
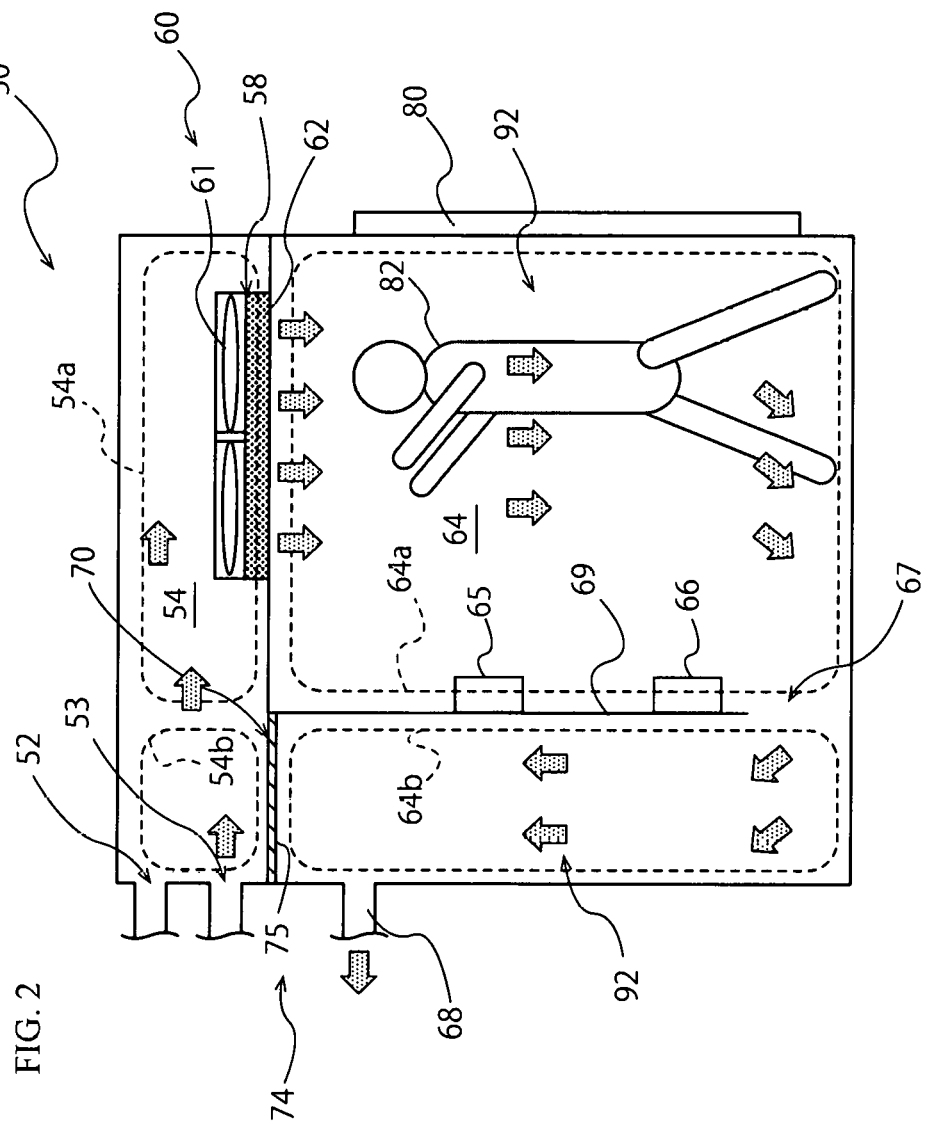
FIG. 2 is a conceptual diagram showing an airflow of a dry air at the time of introduction thereof in the EFEM shown in FIG. 1.

FIG. 2 is a conceptual diagram showing an airflow of a dry air at the time of introduction thereof into the EFEM 50 shown in FIG. 1. As shown in FIG. 2, the dry air introduction port 53 is disposed on the side wall or the ceiling of the first chamber 54, and the dry air is introduced into the first chamber 54 via the dry air introduction port 53. When the EFEM 50 is in the normal operation, the EFEM 50 is filled with nitrogen gas as shown in FIG. 1, but when the person 82 needs to enter the second chamber 64 of the EFEM 50 for maintenance or so, the dry air is introduced into the EFEM 50 as shown in FIG. 2. The humidity of the dry air is preferably 0 to 10%, more preferably 0 to 5%. Incidentally, the dry air may be referred to as a clean dry air (CDA) or a dry air.

In the state of FIG. 2, the valve 75 of the ventilation state switchable unit 74 blocks the second communication section 70, and the first chamber 54 and the second chamber 64 are connected via only the first communication section 58. The airflow formation unit 60 is not being driven in the introduction of the dry air, but the dry air is introduced continuously from the dry air introduction port 53 into the first chamber 54 while the second communication section 70 is being blocked, and the dry air is thereby introduced into the first communication section 58 with the filter 62 and flows into the second progress section 64a of the second chamber 64 via the filter 62. Moreover, the dry air flowed into the second progress section 64a of the second chamber 64 goes downward in the second progress section 64a, enters the second regress section 64b via the lower communication section 67, goes upward in the second regress section 64b, and is discharged from the gas discharge port 68.

The gas discharge port 68 discharges gases of the second chamber 64 therefrom. Discharged from the gas discharge port 68 are the dry air introduced from the dry air introduction port 53 into the EFEM 50 as shown in FIG. 2, the nitrogen gas introduced from the gas introduction port 52 as shown in FIG. 1, an air in the factory flowed from the openable door 80 into the second chamber 64, and the like. When the circulating airflow shown in FIG. 1 is formed, the discharge of the gases from the gas discharge port 68 may be stopped, and an amount of gases corresponding to an amount of gas supplied from the gas introduction port 52 may be discharged from the gas discharge port 68. In the non-circulating state of FIG. 2, an amount of gases corresponding to an amount of the dry air supplied from the dry air introduction port 53 may be discharged from the gas discharge port 68.

The gas discharge port 68 is connected with the second regress section 64b of the second chamber 64, and the gas discharge port 68 is connected with the second chamber 64 at a position that is closer to the second communication section 70 than the first communication section 58. As shown in FIG. 2, the second communication section 70 blocked by the ventilation state switchable unit 74 is positioned below the dry air introduction port 53 of the first chamber 54 and above the gas discharge port 68 connected with the second chamber 64. The gas discharge port 68 according to the present embodiment is a natural exhaust mechanism having no means of ventilation like a fan, but the gas discharge port 68 of the present invention may be a forced discharge mechanism having a means of ventilation.

Figure 5:
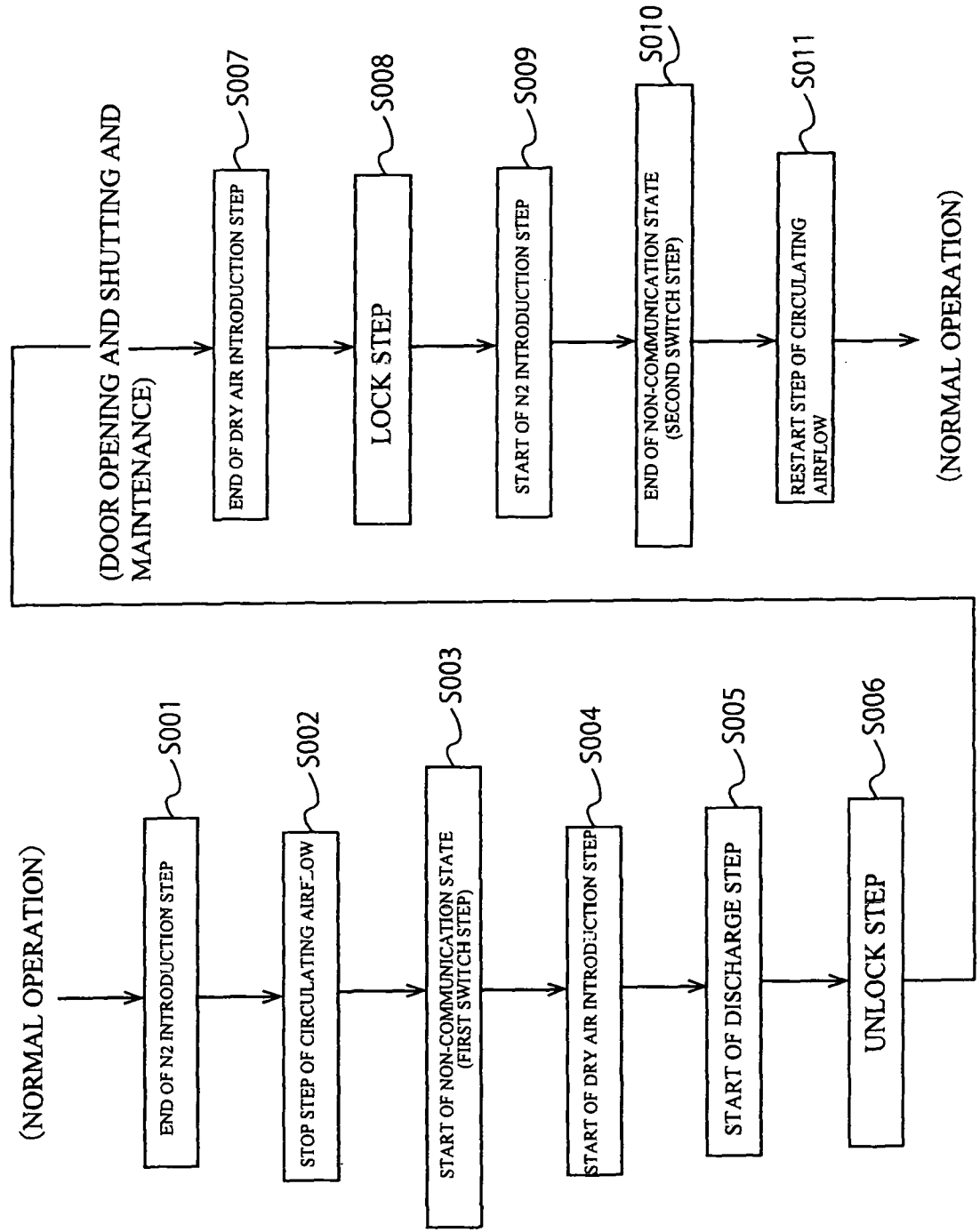
FIG. 5 is a flowchart showing a method of introducing a dry air into the EFEM shown in FIG. 1.

FIG. 5 is a flowchart showing a method of introducing a dry air into the EFEM 50 shown in FIG. 1 and FIG. 2. The method of introducing a dry air begins from Step S001 shown in FIG. 5, for example, in a normal operation where the EFEM 50 is filled with nitrogen gas as shown in FIG. 1.

In Step S001 of FIG. 5, finished is a nitrogen-gas introduction step where a nitrogen gas is introduced into the first chamber 54 via the gas introduction port 52. In the normal operation before Step S001, the nitrogen gas is supplied into the first chamber 54 via the gas introduction port 52 as necessary for prevention of increase in oxygen concentration and for replacement of the replacement gas. Since there is no need to introduce the nitrogen gas at the time of introduction of the dry air, however, the nitrogen gas is not being introduced into the EFEM 50 until the nitrogen gas begins to be introduced again in Step S009 after Step S001 of FIG. 5.

In Step S002 of FIG. 5, carried out is a stop step where the airflow formation unit 60 configured to produce a circulating airflow between the first chamber 54 and the second chamber 64 shown in FIG. 1 is stopped being driven. Specifically, a controller (not shown) stops the driving of the airflow formation unit 60, and the ventilation fan 61 of the airflow formation unit 60 stops rotating.

In Step S003 of FIG. 5, carried out is a first switch step where a ventilation state of the second communication section 70 is switched so that the EFEM 50 is in a non-circulating state. More specifically, a controller (not shown) drives the valve 75 of the ventilation state switchable unit 74, and a ventilation state of the second communication section 70 is switched by switching a state where the valve 75 does not block the second communication section 70 as shown in FIG. 1 to a state where the valve 75 blocks the second communication section 70 as shown in FIG. 2.

In a normal operation state where a circulating airflow is formed between the first chamber 54 and the second chamber 64 as shown in FIG. 1, a ventilation amount of gas (nitrogen gas) in the first communication section 58 is substantially the same as a ventilation amount of gas (nitrogen gas) in the second communication section 70. On the other hand, when the EFEM 50 is in the non-circulating state as shown in FIG. 2, a ventilation amount of gas (dry air) in the first communication section 58 with the filter 62 is larger than a ventilation amount of gas (dry air) in the second communication section 70, and it is particularly preferred that the gas (dry air) cannot pass the second communication section 70 in the non-circulating state.

In Step S004 of FIG. 5, started is an introduction step where a dry air is introduced into the first chamber 54 via the dry air introduction port 53. Since the second communication section 70 is blocked by the valve 75 in Step S003, as shown in FIG. 2, the dry air introduced into the first chamber 54 flows toward the filter 62 of the first communication section 58 and then enters the second chamber 64 via the filter 62, and the airflow of the dry air as shown by the arrows 92 is formed in the first chamber 54 and the second chamber 64.

In Step S005 of FIG. 5, started is a discharge step where gases of the second chamber 64 are discharged from the gas discharge port 68. When the gas discharge port 68 carries out a natural discharge, not a forced discharge using a fan for discharge or so, the discharge step is started along with the start of the introduction of the dry air in Step S004 and the start of the inflow of the gases in the first chamber 54 into the second chamber 64. Discharged from the gas discharge port 68 are a nitrogen gas filled in the first chamber 54 and the second chamber 64 in the normal operation and a dry air introduced into the EFEM 50 and passed the filter 62 in the introduction step.

The introduction step, where the dry air is introduced into the first chamber 54, and the discharge step, where the gases in the second chamber 64 are discharged therefrom, are carried out continuously, and the nitrogen gas is thereby replaced to the dry air in the first chamber 54 and the second chamber 64. As a result, an oxygen concentration of the second chamber 64 increases.

In Step S006 of FIG. 5, carried out is an unlock step where the openable door 80 is unlocked. In the unlock step, a controller (not shown) drives the lock mechanism and unlocks the openable door 80. The unlock step of Step S006 enables a person 82 for maintenance (maintenance worker) to open the openable door 80 from outside. At this time, the controller of the EFEM 50 according to the present embodiment unlocks the openable door 80, provided that the EFEM 50 is in the non-circulating state, and that the introduction step, where the dry air is introduced into the first chamber 54, is still carried out. For the sake of securing safety, the controller of the EFEM 50 according to the present embodiment unlocks the openable door 80, provided that a detection value of the oxygen densitometer 66 in the second chamber 64 is confirmed and indicates a predetermined value or more of oxygen concentration, in addition to the above-mentioned conditions.

After the openable door 80 is unlocked, the person 82 for maintenance opens and shuts the openable door 80 to enter the second chamber 64, operates maintenance in the EFEM 50, and then opens and shuts the openable door 80 once again to go out from the second chamber 64. When the openable door 80 is opened and shut for the enter of the person 82, a non-dry air in a semiconductor factory that is an installation environment of the EFEM 50 flows into the second chamber 64 to some degree. Since the airflow of the dry air as shown by the arrows 92 in FIG. 2 is formed in the EFEM 50, however, a non-dry air and a water vapor contained in this non-dry air flowed into the second chamber 64 via the opening of the openable door 80 are mostly discharged from the gas discharge port 68 without flowing toward the filter 62.

Since the stop step is carried out in Step S002 shown in FIG. 5, the airflow formation unit 60 is not being driven in opening and shutting the openable door 80. Thus, the gases in the second progress section 64a of the second chamber 64 are prevented from being mixed by the ventilation fan 61, and a part of a non-dry air and is flowed into the second chamber 64 and a water vapor contained in this air is further effectively prevented from flowing into the filter 62.

After the end of the maintenance operation, the controller of the EFEM 50 stops the introduction of the dry air into the first chamber 54 via the dry air introduction port 53, and the introduction step of the dry air is finished in Step S007 of FIG. 5. The controller of the EFEM 50 carries out a lock step (Step S008) where the openable door 80 is locked along with the stop of the introduction of the dry air in Step S007.

In Step S009 of FIG. 5, started (re-started) is a nitrogen-gas introduction step where a nitrogen gas is introduced into the first chamber 54 via the gas introduction port 52. Similarly to the airflow of the dry air shown in FIG. 2, the nitrogen gas supplied into the first chamber 54 via the gas introduction port 52 flows toward the filter 62 of the first communication section 58 and enters the second chamber 64 via the filter 62. Since the gas introduction step is carried out continuously, the dry air is discharged from the gas discharge port 68 and is replaced with the nitrogen gas in the first chamber 54 and the second chamber 64. Incidentally, the replacement with the nitrogen gas in the first chamber 54 and the second chamber 64 can be carried out while the EFEM 50 is in a circulating state as shown in FIG. 1, but if this replacement is carried out while the EFEM 50 is in a non-circulating state as shown in FIG. 2, it is possible to more efficiently discharge the dry air and to reduce the time for replacement. From the same reason, the replacement with the nitrogen gas in the first chamber 54 and the second chamber 64 is preferably carried out while the airflow formation unit 60 is not being driven.

In Step S010, carried out is a second switch step where the non-circulating state of the EFEM 50 as shown in FIG. 2 is finished and a ventilation state of the second communication section 70 is switched so that a circulating airflow can be produced between the first chamber 54 and the second chamber 64 of the EFEM 50. More specifically, the controller of the EFEM 50 drives the valve 75 of the ventilation state switchable unit 74 after confirming that a detection value of the oxygen densitometer 66 in the second chamber 64 is under a predetermined value, and the ventilation state of the second communication section 70 is switched by switching a state where the valve 75 blocks the second communication section 70 as shown in FIG. 2 to a state where the valve 75 does not block the second communication section 70 as shown in FIG. 1.

In Step S011 of FIG. 5, carried out is a re-start step where the airflow formation unit 60 configured to produce a circulating airflow between the first chamber 54 and the second chamber 64 starts (re-started) being driven. Specifically, when a controller (not shown) starts driving the airflow formation unit 60, the ventilation fan 61 of the airflow formation unit 60 rotates, and a circulating airflow of nitrogen gas as shown by the arrows 90 of FIG. 1 is formed in the first chamber 54 and the second chamber 64. Accordingly, the EFEM 50 can carry out a maintenance operation by introducing the dry air into the first chamber 54 and the second chamber 64 and can subsequently return to the normal operation by introducing the nitrogen gas into the first chamber 54 and the second chamber 64 once again.

In the EFEM 50, which can introduce the dry air, the second communication section 70 is blocked by the ventilation state switchable unit 74 as shown in FIG. 2, and a dry air introduced into the first chamber 54 can effectively be introduced toward the filter 62 of the first communication section 58. In the EFEM 50, even if a non-dry air enters the second chamber 64, this air or a water vapor contained therein can be thereby prevented from flowing into the filter 62 and attaching or adhering thereto. Thus, the EFEM 50 can quickly decrease a humidity of the second chamber 64 of the EFEM 50 after blocking the inflow of the non-dry air even if the humidity increases temporarily, and the EFEM 50 can reduce an operation stop time from maintenance or so to the return of the normal operation.

Figure 4A:
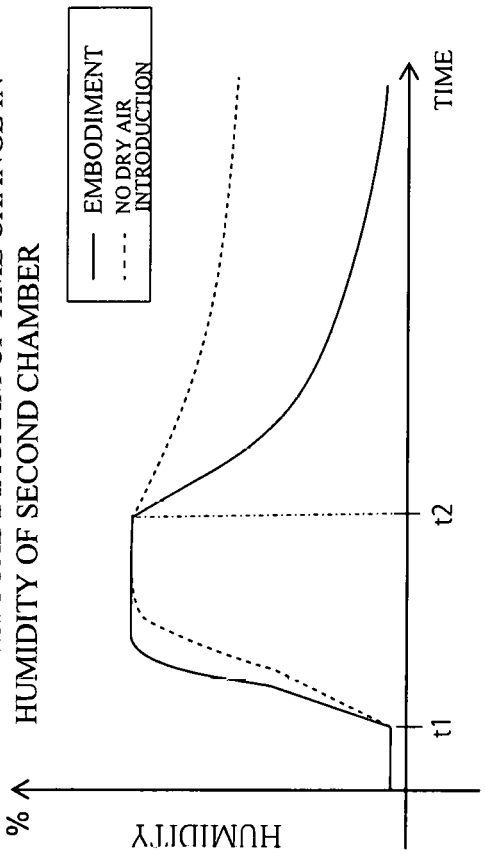
FIG. 4A and FIG. 4B are conceptual diagrams comparing time change of humidity in a second chamber and time change of water content in a filter between the EFEM shown in FIG. 1 and a conventional EFEM.

FIG. 4A shows a comparison of time change of humidity in the second chamber 64 between a conventional EFEM where a dry air is not introduced during maintenance and the EFEM 50 shown in the embodiment. "t1" of FIG. 4A represents a time where a non-dry air in a factory starts flowing into the second chamber 64 by, for example, opening the openable door 80 during maintenance. "t2" of FIG. 4B represents a time where a nitrogen gas starts replacing with gases in the first chamber 54 and the second chamber 64 after the maintenance operation is finished.

As shown in FIG. 4A, the non-dry air in the factory flows into the second chamber 64, and the humidity of the second chamber 64 increases during "t1" to "t2" in both of the EFEMs. After "t2", which is a time where a nitrogen gas starts replacing with gases in the first chamber 54 and the second chamber 64, however, the humidity quickly decreases in the EFEM 50 shown in the embodiment, but the humidity decreases slowly and it takes a long time for the humidity to decrease to a similar level at "t1" in the conventional EFEM. This difference is considered to be relevant to the time change of water content of the filter 62 as shown in FIG. 4B.

Figure 4B:
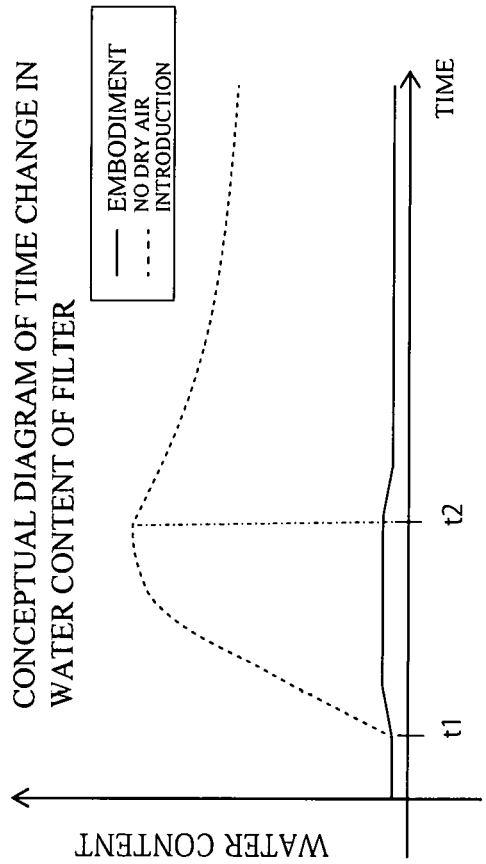

Similarly to FIG. 4A, FIG. 4B shows a comparison of time change of water content of the filter 62 between a conventional EFEM where a dry air is not introduced during maintenance and the EFEM 50 shown in the embodiment. In the conventional EFEM, a water vapor contained in a non-dry air is attached or adhered to the filter 62, and the water content of the filter 62 increases greatly during "t1" to "t2", which is a time where the non-dry air in the factory flows into the second chamber 64. The water vapor attached or adhered to the filter 62 is comparatively strongly combined with the filter 62, and the water content decreases slowly after "t2", where the nitrogen gas starts replacing. In the conventional EFEM, the water attached or adhered to the filter 62 is thereby considered to cause a slow decrease of the humidity as shown in FIG. 4A.

In the EFEM 50 shown in the embodiment, however, the dry air is continuously flowed into the filter 62 during "t1" to "t2", where a non-dry air in the factory flows into the second chamber 64, and this thereby prevents the increase of water content of the filter 62 and hardly stores water in the filter 62 during "t1" to "t2". It is thereby considered that the EFEM 50 can quickly decrease the humidity after "t2", where the replacement of nitrogen gas is started, as shown in FIG. 4A.

As shown in FIG. 2, when the gas discharge port 68 is disposed near the second communication section 70 with the ventilation state switchable unit 74 and disposed away from the first communication section 58 with the filter 62, the EFEM 50 according to the present embodiment can efficiently lead a non-dry air to the gas discharge port 68 and prevent this air from flowing into the first communication section 58 with the filter 62.

Since the ventilation state switchable unit 74 has the valve 75 configured to switch the second communication section 70 to the blocking state and the communicating state, even if a non-dry air flows into the second chamber 64, the EFEM 50 according to the present embodiment can prevent the circulation of this air in the first chamber 54 and the second chamber 64 and the inflow of this air from the first chamber 54 into the filter 62.

Figure 3:
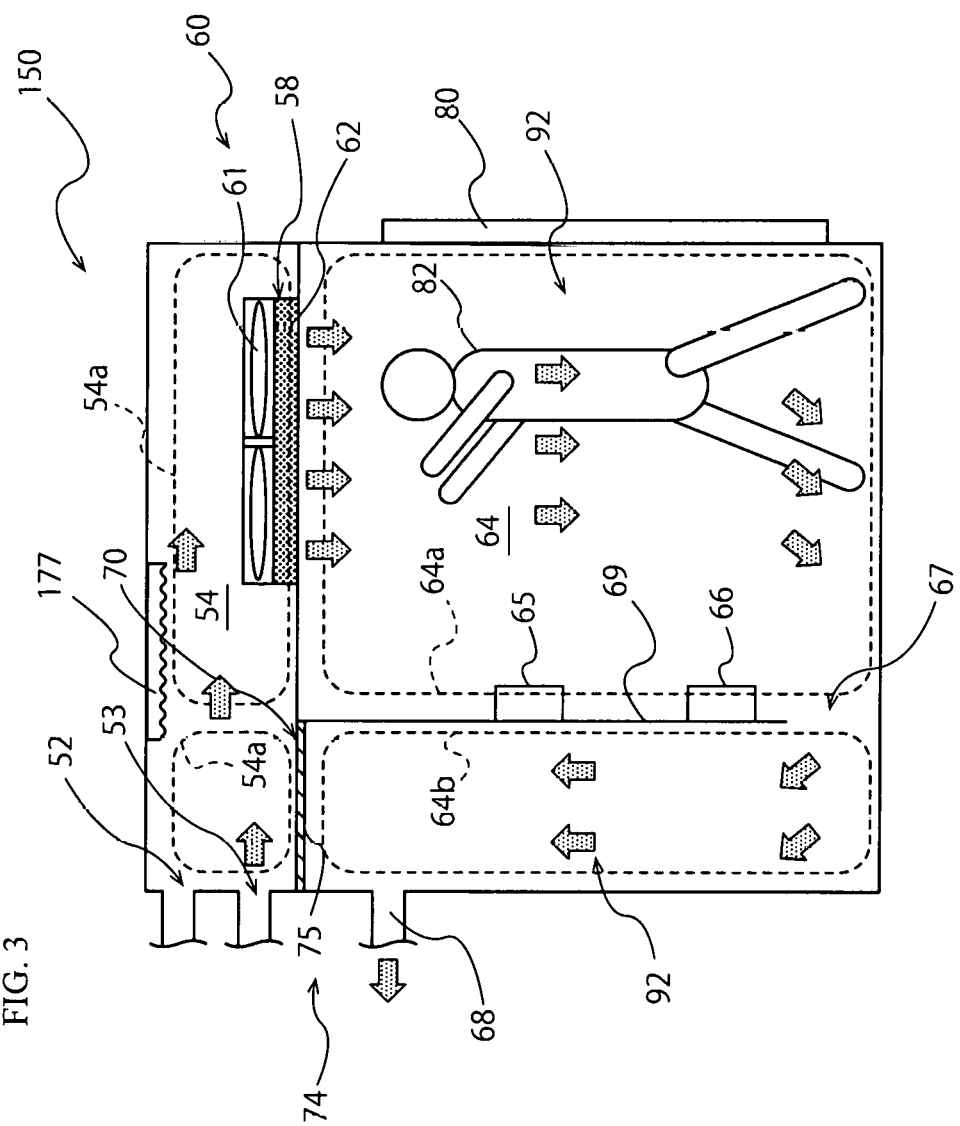
FIG. 3 is a conceptual diagram showing an airflow of a dry air at the time of introduction thereof in an EFEM according to a variation of the present invention.

The present invention is accordingly described based on the embodiment, but is not limited thereto and, needless to say, includes many other embodiments and variations. For example, FIG. 3 is a schematic view showing an EFEM 150 according to a variation of the present invention and corresponds to FIG. 2 of the EFEM 50 according to the embodiment. In addition to the effects demonstrated by the EFEM 50, the EFEM 150 demonstrates the following effects.

The EFEM 150 is similar to the EFEM 50 shown in FIG. 2 except for a heat source 177 disposed in a flow channel of a dry air and configured to heat the dry air to be introduced into the filter 62. In the EFEM 150, the heated dry air can flow into the filter 62 by controlling the heat source 177, and the water attached or adhered to the filter 62 can thereby effectively be removed. The heat source 177 of the EFEM 150 is any heat source, such as heat exchanger and electric heater.

Since the EFEM 150 can more effectively prevent the increase in water content of the filter 62 and further quickly decrease the water content of the filter 62 even if it increases, the delay of decrease in humidity of the second chamber 64 caused by water of the filter 62 can effectively be prevented.

The dry air is introduced into the EFEM 50 not only by the method explained using FIG. 5, but by adding a step to the method, deleting some steps from the method, or switching the order of the steps of the method. The contents and conditions of each step of the method may also appropriately be changeable. In the unlock step (Step S006) of FIG. 5, for example, the fact that the airflow formation unit 60 is not being driven may further be added to the conditions for unlocking the openable door 80. In the EFEM 50, if there is an idling time between the end of maintenance and the start of normal operation, the dry air may continuously be introduced instead of switching the dry air to nitrogen gas to be introduced after the end of maintenance (Steps S007 and S009). In this case, the inside of the EFEM 50 is not replaced with nitrogen, but the humidity of the EFEM 50 can decrease.

The introduction of the dry air into the EFEM 50 shown in FIG. 2 and FIG. 5 is applicable to an EFEM where a dry air circulates between a first chamber and a second chamber during a normal operation.

When the second communication section 70 is blocked as shown in FIG. 2, the valve 75 mentioned above functions as a ventilation resistance portion whose ventilation resistance is higher than that of the filter 62. In the EFEMs 50 and 150 shown in the embodiment and the variation of the present invention, the first communication section 58 and the second communication section 70 are arranged at a substantially same height between the first chamber 54 and the second chamber 64, but this is not only one arrangement of the first communication section 58 and the second communication section 70. The first communication section 58 and the second communication section 70 may be arranged at different heights. In the second chamber 64, the second progress section 64*a*, which is a downward airflow section, and the second regress section 64*b*, which is an upward airflow section, may have different heights.

Figure 6:
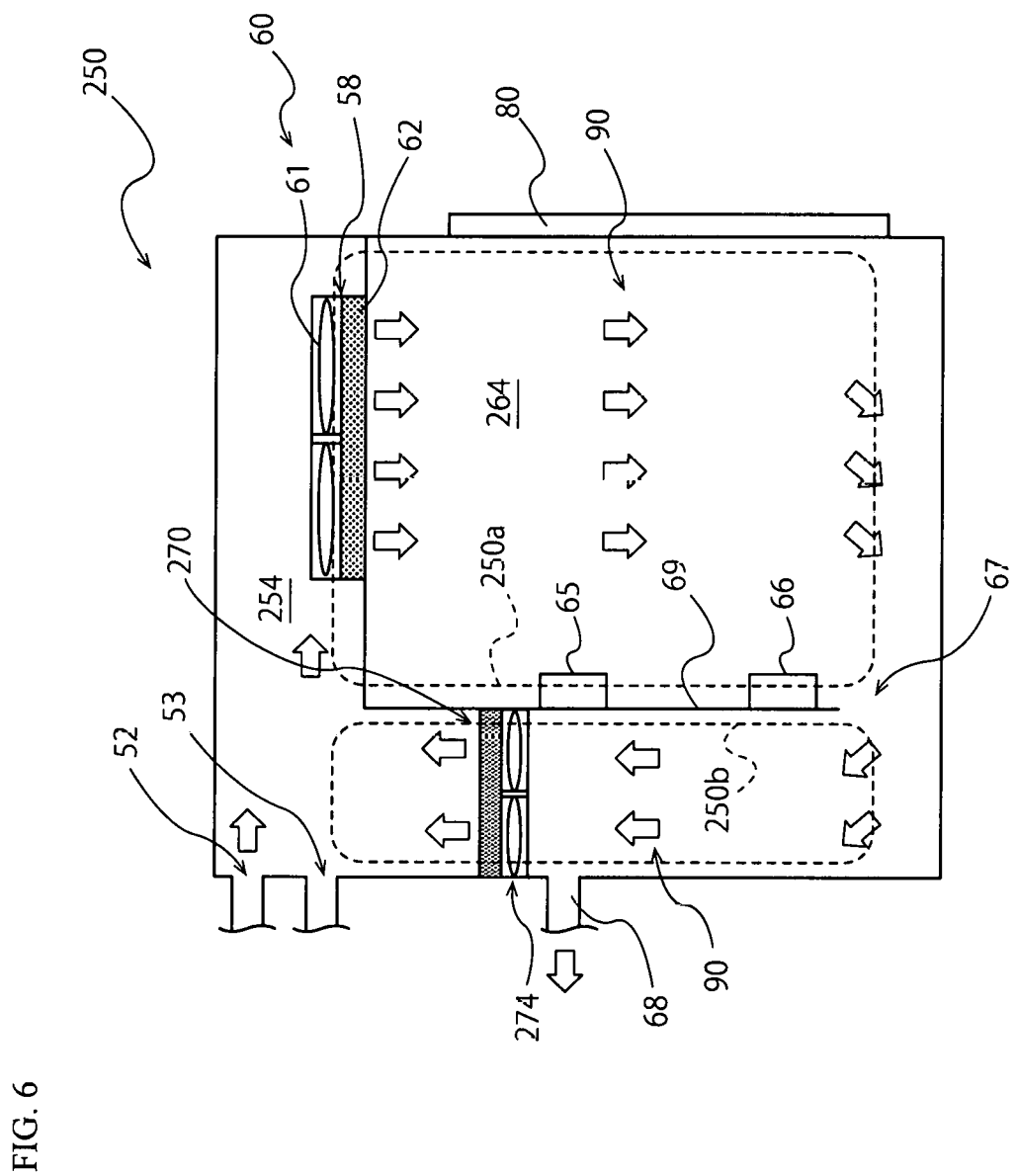
FIG. 6 is a schematic view showing a formation state of a circulating airflow in an EFEM according to Second Embodiment of the present invention.
Figure 7:
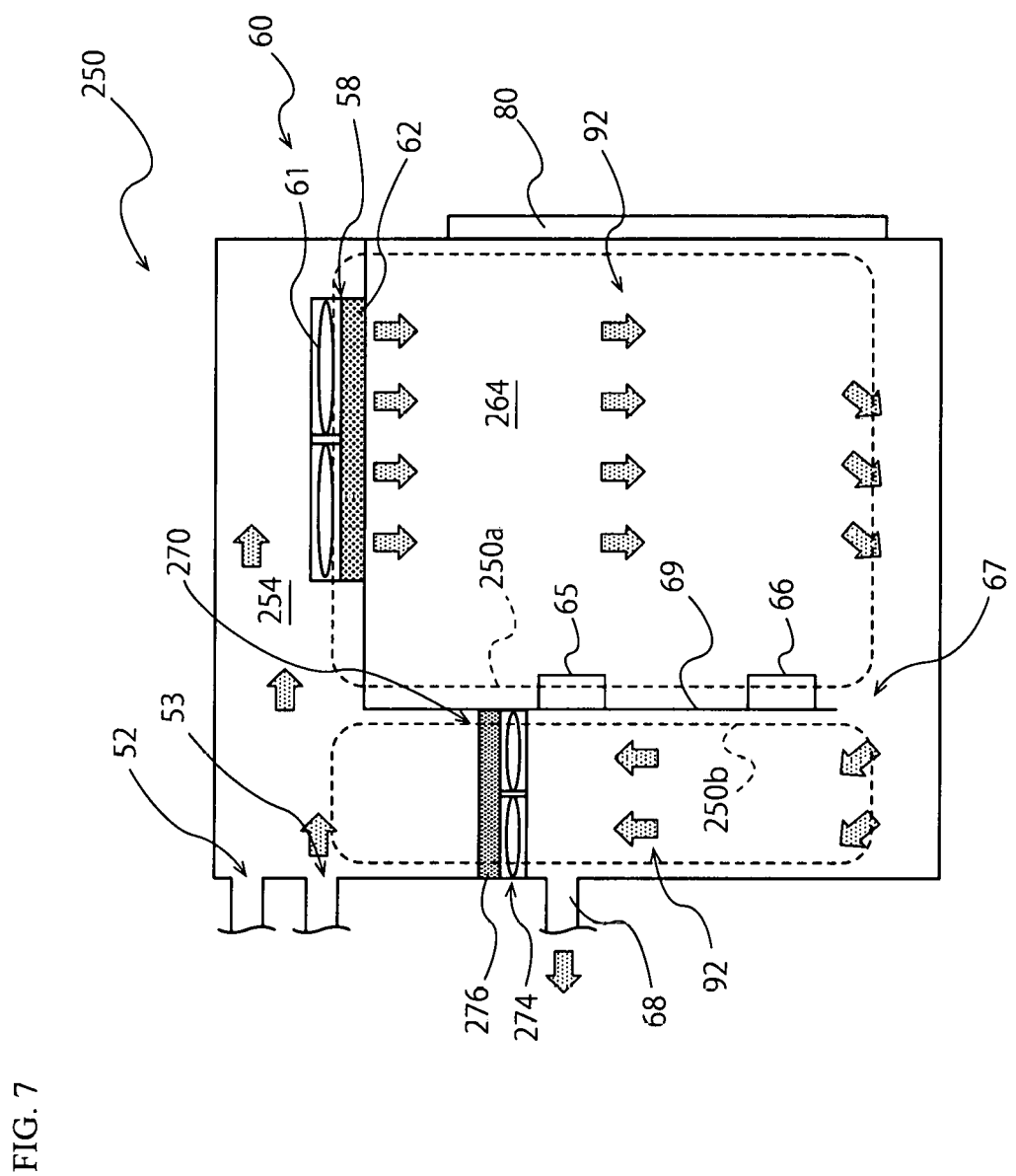
FIG. 7 is a conceptual diagram showing an airflow of a dry air at the time of introduction thereof in the EFEM shown in FIG. 6.

FIG. 6 and FIG. 7 are a schematic view showing an EFEM 250 according to Second Embodiment of the present invention. In the EFEM 250, a second communication section 270 with a second filter 276 and a second airflow formation unit 274 is positioned below the first communication section 58. The EFEM 250 is similar to the EFEM 50 shown in FIG. 1 and FIG. 2 except for the shapes of a first chamber 254 and a second chamber 264 and for the arrangement of the second filter 276 and the second airflow formation unit 274 in the second communication section 270. Thus, the EFEM 250 is described with respect to differences from the EFEM 50, and common matters to the EFEM 50 are not described.

Similarly to the EFEM 50 shown in FIG. 1, the filter 62 and the ventilation fan 61 of the airflow formation unit 60 are arranged in the first communication section 58, and the ventilation fan 61 produces a circulating airflow between the first chamber 254 and the second chamber 264, in the EFEM 250 shown in FIG. 6. The arrows of FIG. 6 represent the directions of the airflow produced in the first chamber 254 and the second chamber 264 during a normal operation.

As shown in FIG. 6, the EFEM 250 includes a downward airflow section 250*a* and an upward airflow section 250*b*. In the downward airflow section 250*a*, a downward airflow is generated while a circulating airflow is being formed. In the upward airflow section 250*b*, an upward airflow is generated while a circulating airflow is being formed. The downward airflow section 250*a* is formed downward from near the ventilation fan 61, and the upward airflow section 250*b* is formed upward from the lower communication section 67. Both of the downward airflow section 250*a* and the upward airflow section 250*b* are formed over the first chamber 254 and the second chamber 264, and the circulating airflow as shown by the arrows is formed in the first chamber 254 and the second chamber 264.

In the EFEM 250, the filter 62 is disposed in the downward airflow section 250*a*, but the gas discharge port 68 is disposed in the upward airflow section 250*b*. The second filter 276 as a ventilation resistance portion whose ventilation resistance is higher than that of the filter 62 is disposed above the gas discharge port 68 of the upward airflow section 250*b*. The second filter 276 is any filter whose ventilation resistance is higher than that of the filter 62, such as a particle removal filter, a chemical filter, and a filter where these filters are combined.

Moreover, the second airflow formation unit 274 configured to change the strength of the upward airflow in the upward airflow section 250*b* is disposed next to the second filter 276 in the upward airflow section 250*b*. The second airflow formation unit 274 may be a fan or so similarly to the airflow formation unit 60, but may be any means that can change the strength of the upward airflow.

The second airflow formation unit 274 can change a ventilation state of the second filter 276 constituting the ventilation resistance portion by changing the strength of the upward airflow in the upward airflow section 250*b*. That is, when the circulating airflow is formed in the first chamber 254 and the second chamber 264, the controller of the EFEM 250 drives the second airflow formation unit 274 in addition to the ventilation fan 61 of the airflow formation unit 60.

Since the second filter 276 disposed in the upward airflow section 250b has a ventilation resistance that is higher than a ventilation resistance of the filter 62 disposed in the downward airflow section 250a, the ventilation fan 61 of the airflow formation unit 60 may not be able to produce a favorable circulating airflow by itself. The controller of the EFEM 250, however, drives the second airflow formation unit 274 so as to increase the strength of the upward airflow in the upward airflow section 250b, and a ventilation amount of the second filter 276 can thereby substantially be equal to that of the filter 62. Thus, a circulating airflow as shown in FIG. 6 can be produced in the first chamber 254 and the second chamber 264 even while the second filter 276 is fixed to block the upward airflow section 250b as shown in FIG. 6.

In a discharge step or so where gases of the first chamber 254 and the second chamber 264 are replaced, the controller of the EFEM 250 stops driving the second airflow formation unit 274 and reduces a ventilation amount of the second filter 276, and a non-circulating state as shown in FIG. 7 can be formed in the first chamber 254 and the second chamber 264. In the discharge step, as shown in FIG. 7, the EFEM 250 is thereby in a non-circulating state where a ventilation amount of dry air in the filter 62 disposed in the downward airflow section 250a is larger than a ventilation amount of dry air in the second filter 276 disposed in the upward airflow section 250b, and gases of the second chamber 264 are discharged from the gas discharge port 68 connected with the second chamber 264 below the second filter 276.

In the EFEM 250 according to Second Embodiment, the second filter 276 as a ventilation resistance portion is disposed above the gas discharge port 68 in the upward airflow section 250b and prevents gases from moving, and a dry air introduced into the first chamber 254 can thereby effectively be introduced into the filter 62 disposed in the downward airflow section 250a. In the EFEM 250, even if a non-dry air flows into the second chamber 264 via the openable door 80 to the outside or so, this air can be prevented from circulating in the EFEM 250 and flowing into the filter 62.

Thus, the EFEM 250 can quickly decrease a humidity of the second chamber 264 of the EFEM 250 after blocking the inflow of the non-dry air even if the humidity increases temporarily, and the EFEM 250 can reduce an operation stop time from maintenance or so to the return of the normal operation. In addition, the EFEM 250 demonstrates effects similar to those of the EFEM 50.

Incidentally, the dry air introduced into the EFEMs 50, 150, and 250 may be an air whose water (water vapor) is removed, a gas where oxygen, nitrogen, etc. are mixed and adjusted in terms of their composition ratio, or the like.

NUMERICAL REFERENCES 50, 150, 250 . . . EFEM
52 . . . gas introduction port
53 . . . dry air introduction port
54, 254 . . . first chamber
54a . . . first progress section
54b . . . first regress section
58 . . . first communication section
60 . . . airflow formation unit
61 . . . fan
62 . . . filter
70, 270 . . . second communication section
74 . . . ventilation state switchable unit
75 . . . valve
64, 264 . . . second chamber
64a . . . second progress section
64b . . . second regress section
65 . . . hygrometer
66 . . . oxygen densitometer
67 . . . lower communication section
68 . . . gas discharge port
69 . . . intermediate wall
80 . . . openable door
82 . . . person
90, 92 . . . arrow
177 . . . heat source

The invention claimed is:

1. An EFEM comprising:
a first chamber including (1) a dry air introduction port configured to introduce a dry air into the first chamber and (2) a gas introduction port configured to introduce a replacement gas consisting of inert gas into the first chamber;
a second chamber connected with a lower part of the first chamber and including an openable door allowing a person to go in and out of the second chamber;
an airflow formation unit configured to produce a circulating airflow between the first chamber and the second chamber;
a ventilation state switchable unit configured to control ventilation of air from the second chamber to the first chamber;
a gas discharge port configured to directly discharge a gas from the second chamber,
wherein the first chamber and the second chamber are connected via:
a first communication section where a filter is disposed, and configured such that the circulating airflow goes from the first chamber to the second chamber through the first communication section when the circulating airflow is produced by the airflow formation unit; and
a second communication section where the ventilation state switchable unit is disposed, and configured such that the ventilation state switchable unit either permits or prevents the ventilation of air from the second chamber to the first chamber; and
the ventilation state switchable unit is located (i) below the dry air introduction port and the gas introduction port and (ii) above the gas discharge port.

2. The EFEM according to claim 1, wherein
the gas discharge port is connected with the second chamber at a position that is closer to the second communication section than the first communication section, and
the ventilation state switchable unit is disposed in the second communication section positioned below the dry air introduction port and above the gas discharge port.

3. The EFEM according to claim 2, wherein the ventilation state switchable unit comprises a valve configured to switch a ventilation state of the second communication section between:
a state where the gas is movable from the second chamber to the first chamber via the second communication section; and
a state where the gas is unmovable from the second chamber to the first chamber via the second communication section.

4. An EFEM comprising:
a first chamber including a dry air introduction port configured to introduce a dry air into the first chamber and a gas introduction port configured to introduce a replacement gas consisting of inert gas into the first chamber;
a second chamber connected with a lower part of the first chamber and including an openable door to the outside;
an airflow formation unit configured to produce a circulating airflow between the first chamber and the second chamber; and
a gas discharge port configured to directly discharge a gas from the second chamber,
wherein the first chamber and the second chamber comprise:
a downward airflow section where a downward airflow is generated when the circulating airflow is produced by the airflow formation unit, and
an upward airflow section where an upward airflow is generated when the circulating airflow is produced by the airflow formation unit,
wherein a filter is disposed in the downward airflow section,
wherein the gas discharge port is disposed in the upward airflow section,
wherein a ventilation resistance portion whose ventilation resistance is higher than that of the filter is disposed above the gas discharge port in the upward airflow section, and
wherein the ventilation state unit is located (i) below the dry air introduction port and the gas introduction port and (ii) above the gas discharge port.

5. The EFEM according to claim 4, wherein the ventilation resistance portion comprises a second filter whose ventilation resistance is higher than that of the filter.

6. The EFEM according to claim 5, further comprising a second airflow formation unit disposed in the upward airflow section and configured to switch a ventilation state of the upward airflow passing through the ventilation resistance portion by changing a strength of the upward airflow in the upward airflow section.

7. The EFEM according to claim 4, wherein the ventilation resistance portion comprises a valve configured to switch a ventilation state of the ventilation resistance portion between:
a state where the gas is movable from the second chamber to the first chamber via the ventilation resistance portion; and
a state where the gas is unmovable from the second chamber to the first chamber via the ventilation resistance portion.

8. A method of introducing a dry air into an EFEM, comprising:
a stop step to stop introduction of a replacement gas consisting of inert gas that is being introduced into a first chamber via a gas introduction port;
an introduction step of introducing the dry air into the first chamber via a dry air introduction port;
a switch step of switching a ventilation state of a second communication section among first and second communication sections connecting the first chamber and a second chamber connected with a lower part of the first chamber so that the ventilation state becomes a non-circulating state where a ventilation amount of the dry air in the first communication section with a filter is larger than a ventilation amount of the dry air in the second communication section; and
a discharge step of directly discharging a gas from the second chamber,
wherein the ventilation state switchable unit switching a ventilation state of the second communication section is located (i) below the dry air introduction port and the gas introduction port and (ii) above the gas discharge port.

9. The method according to claim 8, wherein the gas of the second chamber is discharged in the discharge step from a gas discharge port connected with the second chamber at a position that is closer to the second communication section than the first communication section.

10. The method according to claim 8, further comprising an unlock step of unlocking an openable door disposed in the second chamber and allowing a person to go in and out in the non-circulating state during the introduction step.

11. The method according to claim 9, further comprising an unlock step of unlocking an openable door disposed in the second chamber and allowing a person to go in and out in the non-circulating state during the introduction step.

12. A method of introducing a dry air into the EFEM according to claim 4, comprising:
an introduction step of introducing the dry air into a first chamber via a dry air introduction port; and
a discharge step of discharging a gas of a second chamber connected with a lower part of the first chamber via a gas discharge port connected with the second chamber below a ventilation resistance portion in an upward airflow section where an upward airflow is generated in a non-circulating state where a ventilation amount of the dry air of a filter disposed in a downward airflow section where a downward airflow is generated is larger than a ventilation amount of the dry air of the ventilation resistance portion in the upward airflow section.

13. The method according to claim 12, wherein a second airflow formation unit disposed in the upward airflow section and configured to change a strength of the upward airflow is stopped from being driven in the discharge step by reducing a ventilation amount of the ventilation resistance portion and producing the non-circulating state.

14. The method according to claim 8, further comprising a stop step of stopping a driving of an airflow formation unit configured to produce a circulating airflow between the first chamber and the second chamber.

15. The method according to claim 9, further comprising a stop step of stopping a driving of an airflow formation unit configured to produce a circulating airflow between the first chamber and the second chamber.

16. The method according to claim 10, further comprising a stop step of stopping a driving of an airflow formation unit configured to produce a circulating airflow between the first chamber and the second chamber.

17. The method according to claim 11, further comprising a stop step of stopping a driving of an airflow formation unit configured to produce a circulating airflow between the first chamber and the second chamber.

18. The method according to claim 12, further comprising a stop step of stopping a driving of an airflow formation unit configured to produce a circulating airflow between the first chamber and the second chamber.

* * * * *